United States Patent
Kim et al.

(10) Patent No.: US 9,361,961 B2
(45) Date of Patent: Jun. 7, 2016

(54) MEMORY DEVICE AND MEMORY SYSTEM INCLUDING THE SAME

(71) Applicant: SK hynix Inc., Gyeonggi-do (KR)

(72) Inventors: Young-Ju Kim, Gyeonggi-do (KR); Dong-Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 30 days.

(21) Appl. No.: 14/303,230

(22) Filed: Jun. 12, 2014

(65) Prior Publication Data

US 2015/0187403 A1 Jul. 2, 2015

(30) Foreign Application Priority Data

Dec. 26, 2013 (KR) .................. 10-2013-0164192

(51) Int. Cl.
*G11C 8/12* (2006.01)
*G11C 11/40* (2006.01)
*G11C 8/18* (2006.01)
*G11C 11/408* (2006.01)
G11C 11/406 (2006.01)

(52) U.S. Cl.
CPC .. *G11C 8/18* (2013.01); *G11C 8/12* (2013.01); *G11C 11/4087* (2013.01); *G11C 11/40618* (2013.01)

(58) Field of Classification Search
CPC ........ G11C 8/18; G11C 8/12; G11C 11/4087; G11C 11/40618
USPC ................................... 365/189.11
See application file for complete search history.

(56) References Cited

U.S. PATENT DOCUMENTS

| | | | | |
|---|---|---|---|---|
| 5,517,459 A * | 5/1996 | Ooishi | ..................... | G11C 8/18 365/189.12 |
| 5,870,350 A * | 2/1999 | Bertin | .................. | G11C 7/1072 365/189.02 |
| 6,067,255 A * | 5/2000 | Jung | ..................... | G11C 7/1072 365/185.11 |
| 6,288,954 B1 * | 9/2001 | Manning | ................ | G11C 29/12 365/189.14 |
| 6,310,816 B2 * | 10/2001 | Manning | ................ | G11C 29/12 365/189.05 |
| 6,449,679 B2 * | 9/2002 | Ryan | ................... | G06F 13/1694 710/315 |
| 6,820,182 B1 * | 11/2004 | Bauman | ............. | G06F 11/2069 707/999.202 |
| 6,915,399 B1 * | 7/2005 | McDonnell | ............... | G06F 5/06 711/154 |
| 7,454,555 B2 * | 11/2008 | Ware | ..................... | G11C 7/1006 711/5 |
| 7,940,598 B2 * | 5/2011 | Kasamsetty | ......... | G11C 7/1018 365/230.03 |
| 7,957,209 B2 * | 6/2011 | Ruckerbauer | ............ | G11C 8/12 365/191 |
| 7,986,582 B2 * | 7/2011 | Ruckerbauer | ............ | G11C 5/04 365/230.05 |
| 8,717,828 B2 * | 5/2014 | Kim | ....................... | G11C 5/063 365/189.011 |
| 9,209,160 B2 * | 12/2015 | Lee | ..................... | H01L 25/0657 |
| 9,269,419 B2 * | 2/2016 | Lee | ..................... | G11C 7/1018 |

(Continued)

FOREIGN PATENT DOCUMENTS

| KR | 100543906 | 1/2006 |
|---|---|---|
| KR | 1020080062174 | 7/2008 |

*Primary Examiner* — Hoai V Ho
*Assistant Examiner* — Roberto Mancera, Jr.
(74) *Attorney, Agent, or Firm* — IP & T Group LLP

(57) ABSTRACT

A memory device may include a plurality of memory banks, a row control signal input unit suitable for receiving a plurality of row control signals, a column control signal input unit suitable for receiving a plurality of column control signals, a row control unit suitable for selecting a memory bank and a row in response to the row control signals, and controlling a row operation for the selected row, and a column control unit suitable for selecting a memory bank and column in response to the column control signals, and controlling a column operation for the selected column.

11 Claims, 7 Drawing Sheets

(56) References Cited

U.S. PATENT DOCUMENTS

| | | | | |
|---|---|---|---|---|
| 2004/0264286 A1* | 12/2004 | Ware | G11C 7/1006 | 365/232 |
| 2005/0138276 A1* | 6/2005 | Navada | G06F 13/1647 | 711/105 |
| 2007/0153602 A1* | 7/2007 | Kang | G11C 5/025 | 365/207 |
| 2008/0126576 A1* | 5/2008 | Heo | G06F 1/10 | 710/4 |
| 2008/0151670 A1* | 6/2008 | Kawakubo | G11C 7/1027 | 365/222 |
| 2008/0151678 A1* | 6/2008 | Ikeda | G11C 8/12 | 365/230.03 |
| 2010/0110747 A1* | 5/2010 | Nakaoka | G11C 11/4076 | 365/51 |
| 2011/0128810 A1* | 6/2011 | Sato | G06F 9/345 | 365/230.06 |
| 2012/0155200 A1* | 6/2012 | Moon | G11C 8/12 | 365/193 |
| 2013/0077428 A1* | 3/2013 | Kondo | G11C 7/1045 | 365/230.06 |
| 2015/0098284 A1* | 4/2015 | Lee | G11C 8/12 | 365/193 |

* cited by examiner

FIG. 4A

| COMMAND | CKE N-1 | CKE N | CLOCK EDGE | R<0> | R<1> | R<2> | R<3> | R<4> | R<5> |
|---|---|---|---|---|---|---|---|---|---|
| RNOP | H | H | RE1 | H | H | H | V | V | V |
|  |  |  | FE1 | V | V | V | V | V | V |
| ACT | H | H | RE1 | L | H | RA<15> | RBA<0> | RBA<1> | RBA<2> |
|  |  |  | FE1 | RA<11> | RA<12> | PAR | RA<13> | RA<14> | RBA<3> |
|  |  |  | RE2 | RA<5> | RA<6> | RA<7> | RA<8> | RA<9> | RA<10> |
|  |  |  | FE3 | RA<0> | RA<1> | PAR | RA<2> | RA<3> | RA<4> |
| PRE | H | H | RE1 | H | H | L | RBA<0> | RBA<1> | RBA<2> |
|  |  |  | FE1 | V | V | PAR | V | L | V |
| PREA | H | H | RE1 | H | H | L | V | V | RBA<3> |
|  |  |  | FE1 | V | V | PAR | V | H | V |
| REFS | H | H | RE1 | L | L | H | RBA<0> | RBA<1> | RBA<2> |
|  |  |  | FE1 | V | V | PAR | V | L | V |
| REF | H | H | RE1 | L | L | H | V | H | V |
|  |  |  | FE1 | V | V | PAR | V | L | V |
| SRE | H | L | RE1 | H | L | H | V | H | V |
|  |  |  | FE1 | V | V | PAR | V | L | V |
| PDE | L | L | RE1 | H | H | H | V | V | V |
|  |  |  | FE1 | V | V | PAR | V | V | V |
| SRX/PDX | L | H | RE1 | H | H | V | V | V | V |
|  |  |  | FE1 | V | V | V | V | V | V |

FIG. 4B

| COMMAND | CKE N-1 | CKE N | CLOCK EDGE | C<0> | C<1> | C<2> | C<3> | C<4> | C<5> | C<6> | C<7> |
|---|---|---|---|---|---|---|---|---|---|---|---|
| CNOP | H | H | RE1 | H | H | H | V | V | V | V | V |
|  |  |  | FE1 | V | V | PAR | V | V | V | V | V |
| RD | H | H | RE1 | H | L | H | L | CBA<0> | CAB<1> | CBA<2> | CBA<3> |
|  |  |  | FE1 | CA<0> | CA<1> | PAR | CA<2> | CA<3> | CA<4> | CA<5> | CA<6> |
| RDA | H | H | RE1 | H | L | H | H | CBA<0> | CBA<1> | CBA<2> | CBA<3> |
|  |  |  | FE1 | CA<0> | CA<1> | PAR | CA<2> | CA<3> | CA<4> | CA<5> | CA<6> |
| WR | H | H | RE1 | H | L | L | L | CBA<0> | CBA<1> | CBA<2> | CBA<3> |
|  |  |  | FE1 | CA<0> | CA<1> | PAR | CA<2> | CA<3> | CA<4> | CA<5> | CA<6> |
| WRA | H | H | RE1 | H | L | L | H | CBA<0> | CBA<1> | CBA<2> | CBA<3> |
|  |  |  | FE1 | CA<0> | CA<1> | PAR | CA<2> | CA<3> | CA<4> | CA<5> | CA<6> |

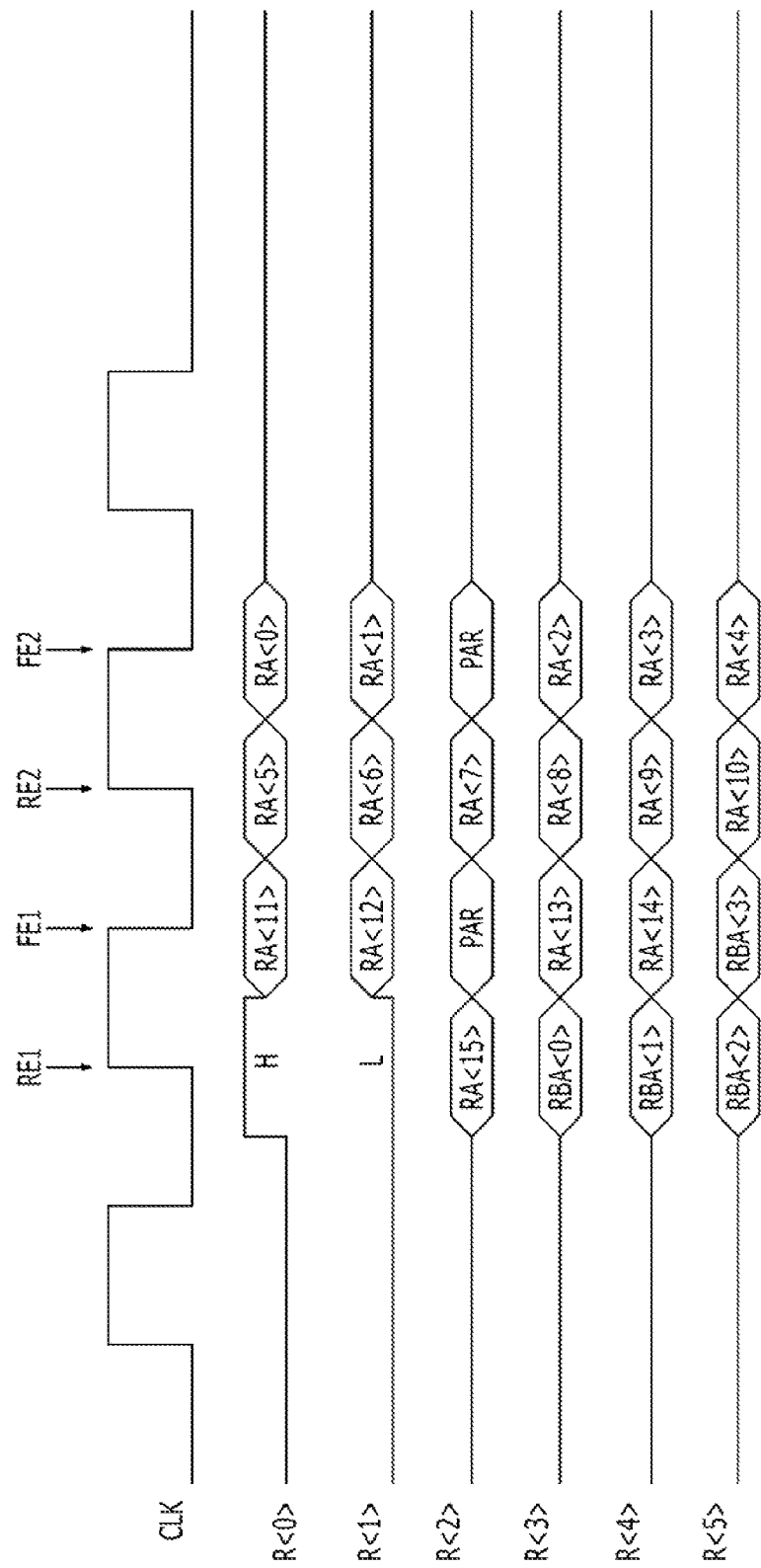

MEMORY DEVICE AND MEMORY SYSTEM INCLUDING THE SAME

CROSS-REFERENCE TO RELATED APPLICATIONS

The present application claims priority of Korean Patent Application No. 10-2013-0164192 filed on Dec. 26, 2013, which is incorporated herein by reference in its entirety.

BACKGROUND

1. Field

Exemplary embodiments of the present invention relate to a memory device and a memory system.

2. Description of the Related Art

A memory device includes a memory cell area, having a plurality of memory banks, and peripheral circuits for controlling data input/output of the memory cell area. A memory bank is a group of memory cells for storing data, and the memory cells are arranged in a plurality of rows and columns to form a cell array. An address is assigned to each of the rows and columns.

In a memory device, a data access operation in one memory bank includes activating a word line corresponding to an applied row address, reading or writing data from or to a memory cell, which is coupled to a bit line corresponding to an applied column address, among the memory cells coupled to the activated word lines and precharging the word line. As such, the operation of the memory cell area (e.g., a memory bank) may be classified into a row operation for controlling word lines and a column operation for controlling bit lines.

FIG. 1 is a block diagram illustrating a conventional memory device.

Referring to FIG. 1, the memory device may include a command input unit 110, an address input unit 120, a command decoder 130, a bank selection unit 140, and a memory cell area 150. The memory cell area 150 may include eight memory banks BANK0 to BANK7.

The command input unit 110 may receive a plurality of command signals CMDs transmitted from an external source, and the address input unit 120 may receive a plurality of address signals ADDS transmitted from an external source. The command input unit 110 and the address input unit 120 may receive the command signals CMDs and the address signals ADDs in synchronization with a clock CLK. The address signals ADDs may include bank addresses BADDs for selecting memory banks, row address RADDs for selecting rows (i.e., word lines), or column addresses CADDs for selecting columns (i.e., bit lines). Each of the bank addresses BADDs, the row addresses RADDs, and the column addresses CADDs may include multiple bits.

The command decoder 130 may decode the command signals CMDs received through the command input unit 110, and enable an internal command ICMD based on a combination of the command signals CMDs. The internal command ICMD corresponding to a row operation may include an activate command, a precharge command, a refresh command and the like, and the internal command ICMD corresponding to a column operation may include a read command, a write command and the like. The bank selection unit 140 may transmit the internal command ICMD generated by the command decoder 130 to a memory bank corresponding to an inputted bank address BADD.

The first to eighth memory banks BANK0 to BANK7 of the memory cell area 150 may receive first to eighth internal commands ICMD_B<0:7>, respectively, and perform a row operation or a column operation using the row addresses RADDs and the column addresses CADDs.

The specifications, which must be obeyed by a memory device such as DRAM may include tRAS (i.e., a time required until one memory bank is precharged after the memory bank is activated), tRP (i.e., a time required until one memory bank is activated after the memory bank is precharged), tRRD (RAS to RAS Delay), tRCD (RAS to CAS Delay) and the like. All of the times may be set on the basis of a clock.

The memory device of FIG. 1 has only one channel for receiving command signals CMDs and one channel for receiving address signals ADDS. Thus, even though the memory banks BANK0 to BANK7 may be controlled independently within the memory device, the memory device has a limitation in receiving command signals CMDs or address signals ADDs for operating two or more memory banks at once. Furthermore, since the command input unit 110 and the address input unit 120 receive command signals CMDs and address signals ADDS at a first rising edge of a clock CLK, respectively, both the command input unit 110 and the address input unit 120 must have a plurality of input pads corresponding to the maximum number of signals that may be inputted simultaneously. Thus, the operation speed of the memory device may be lowered, and the size of the memory package may be increased.

SUMMARY

Various embodiments are directed to a memory device that includes separate channels for receiving row control signals and column control signals reduces the time required for receiving control signals, and operates two or more bank groups simultaneously, and a memory system including the same.

Furthermore, various embodiments are directed to a memory that receives control signals in series for one or more clock cycles and thus reduces the number of input pads required for receiving the control signals, and a memory system including the same.

In an embodiment, a memory device may include a plurality of memory banks, a row control signal input unit suitable for receiving a plurality of row control signals, a column control signal input unit suitable for receiving a plurality of column control signals, a row control unit suitable for selecting a memory bank and a row in response to the row control signals, and controlling a row operation for the selected row, and a column control unit suitable for selecting a memory bank and column in response to the column control signals, and controlling a column operation for the selected column. The row control signal input unit may sequentially receive the row control signals through row input pads, and the column control signal input unit may sequentially receive the column control signals through column input pads.

In an embodiment, a memory system may include a memory device including a plurality of memory banks, suitable for sequentially receiving a plurality of row control signals through row input pads, selecting a memory bank and a row, and performing a row operation for the selected row, and suitable for sequentially receiving a plurality of column control signals through column input pads, selecting a memory bank and column, and performing a column operation for the selected column; and a memory controller suitable for transmitting the row control signals and the column control signals to the memory device, to control the memory device.

In an embodiment, a memory device may include a plurality of memory banks; row input pads suitable for sequentially receiving a plurality of row control signals from a row channel (the row control signals including row command signals), row bank address signals, and row address signals; and column input pads suitable for sequentially receiving a plurality of column control signals from a column channel (the column control signals including column command signals), column bank address signals, and column addresses. The row control signals and the column control signals are synchronized with edges of a clock for one or more clock cycles.

BRIEF DESCRIPTION OF THE DRAWINGS

FIGS. 4A and 4B are truth tables of control signals for the memory device in accordance with an embodiment of the present invention.

FIG. 5 is a waveform diagram for describing an operation of the memory device in accordance with an embodiment of the present invention.

DETAILED DESCRIPTION

Figure 1:
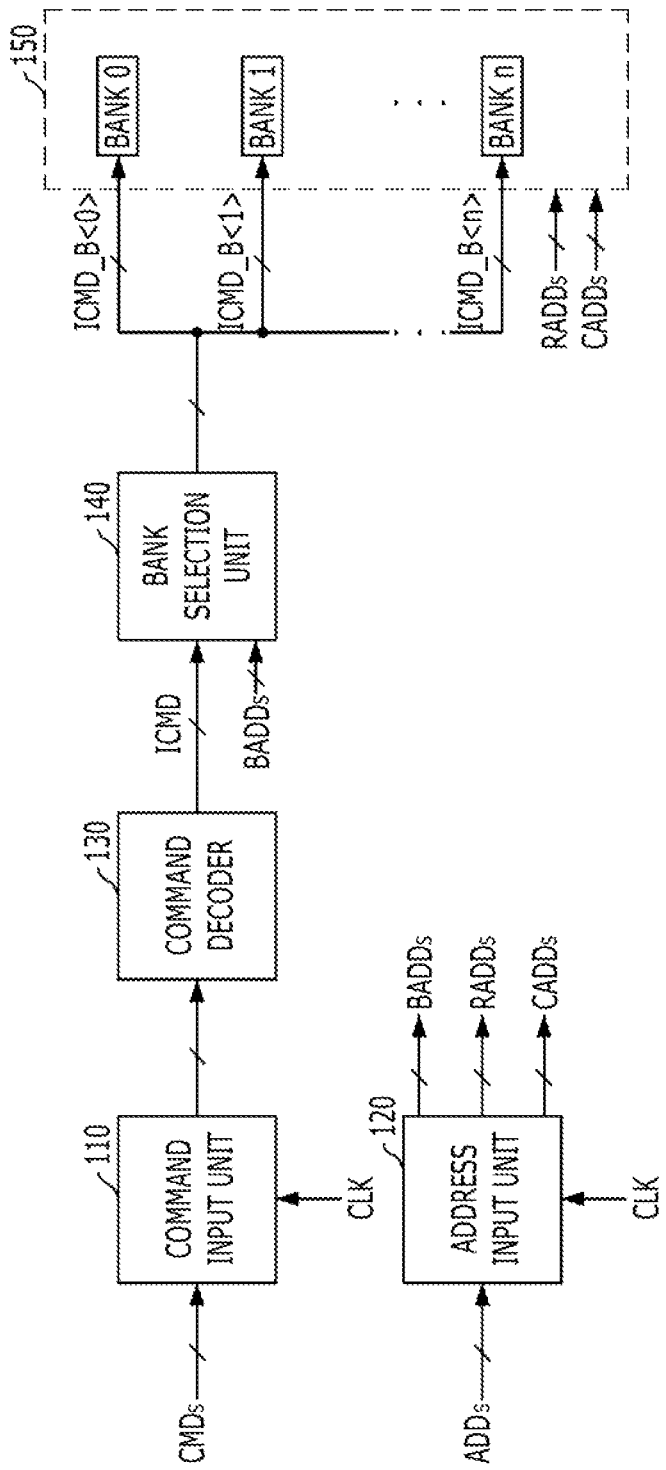
FIG. 1 is a block diagram illustrating a conventional memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and, in some instances, proportions may have been exaggerated in order to clearly illustrate features of the embodiments. In this specification, specific terms have been used. The terms are used to describe the present invention and are not used to qualify the sense or limit the scope of the present invention. It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include the plural form, and vice versa, as long as it is not specifically mentioned. Furthermore, 'include/comprise' or 'including/comprising' used in the specification represents that one or more components, steps, operations, and elements exists or are added.

Figure 2:
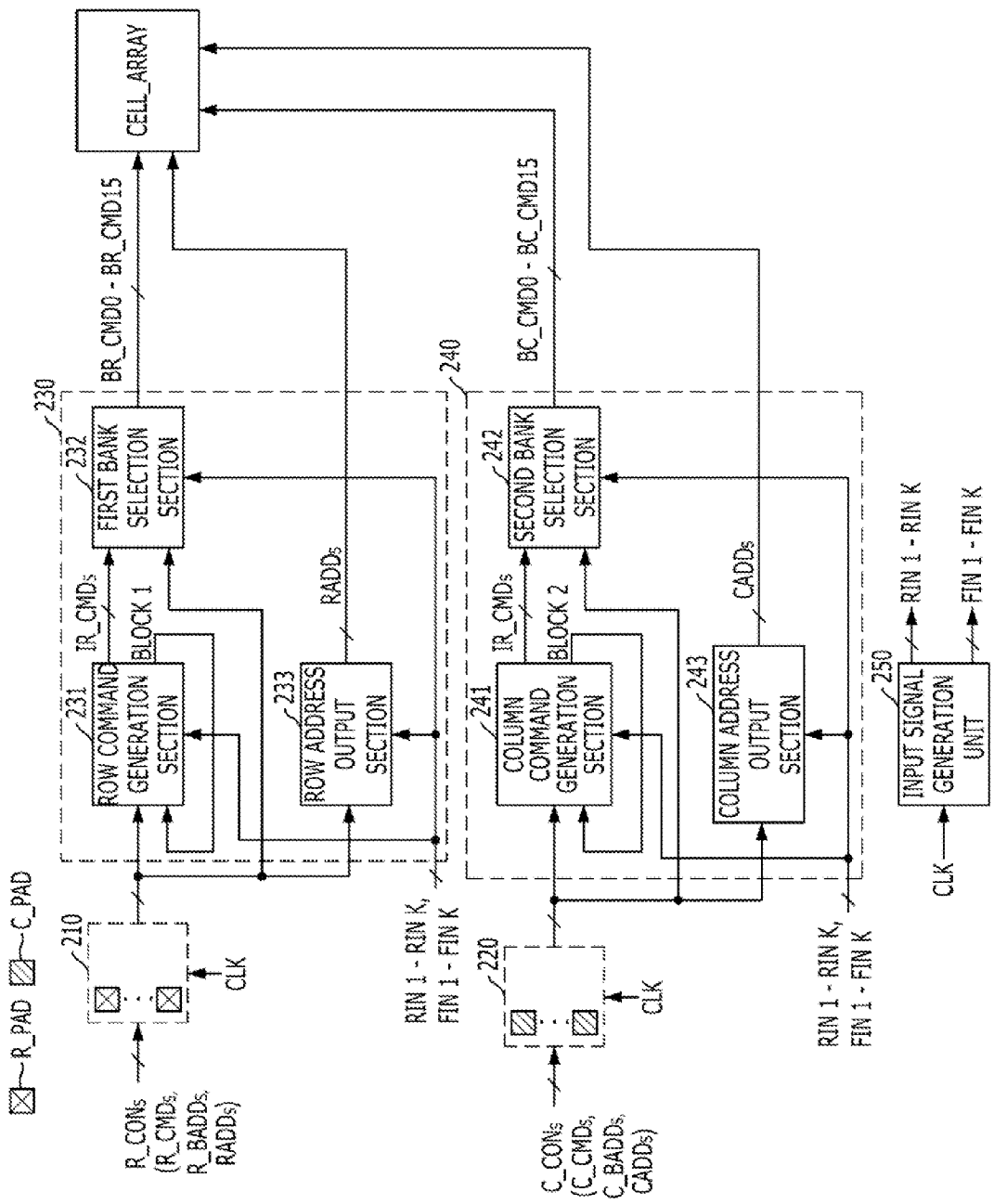
FIG. 2 is a block diagram illustrating a memory device in accordance with an embodiment of the present invention.
Figure 3:
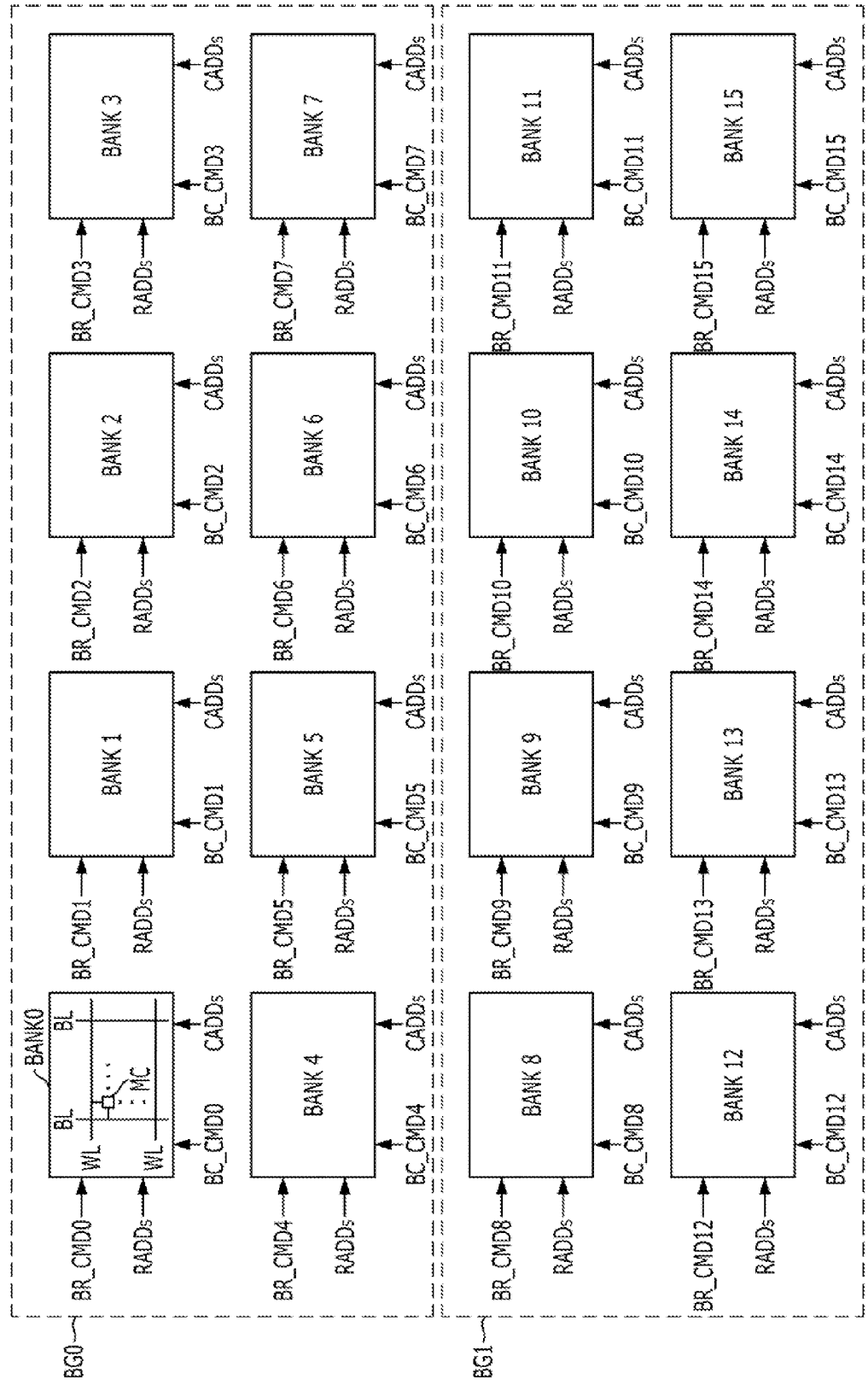
FIG. 3 is a detailed diagram of a cell array shown in FIG. 2.

FIG. 2 is a block diagram illustrating a memory device in accordance with an embodiment of the present invention. FIG. 3 is a detailed diagram of a cell array CELL_ARRAY shown in FIG. 2.

Referring to FIG. 2, the memory device may include a cell array CELL_ARRAY, a row control signal input unit 210, a column control signal input unit 220, a row control unit 230, a column control unit 240, and an input signal generation unit 250. Referring to FIG. 3, the cell array CELL_ARRAY may include a plurality of bank groups BG0 and BG1, each having one or more memory banks.

Each of the first and second bank groups BG0 and BG1 may include one or more memory banks. Each of the memory banks BANK0 to BANK15 may include a plurality of word lines WL, a plurality of bit lines BL, and a plurality of memory cells MC coupled between the word lines WL and bit lines BL. FIG. 3 illustrates a case where the first bank group BG0 includes first to eighth memory banks BANK0 to BANK7 and the second bank group BG1 includes ninth to 16th memory banks BANK8 to BANK15. Each of the bank groups may be controlled to perform a row operation or a column operation simultaneously.

For example, each of the banks groups may be controlled such a manner that a memory bank included in the first bank group BG0 performs a row operation while a memory bank included in the second bank group BG1 performs a row operation, a memory bank included in the first bank group BG0 performs a column operation while a memory bank included in the second bank group BG1 performs a column operation, a memory bank included in the first bank group BG0 performs a row operation while a memory bank included in the second bank group BG1 performs a column operation, or a memory bank included in the first bank group BG0 performs a column operation while a memory bank included in the second bank group BG1 performs a row operation. Each of the word lines WL may correspond to a row, and each of the bit lines BL may correspond to a column. FIG. 3 illustrates only word lines WL, bit lines BL, and memory cells MC of the first memory bank BANK0, for convenience of illustration.

The row control signal input unit 210 may receive a plurality of row control signals R_CONs. The row control signals R_CONs may include one or more row command signals R_CMDs, one or more row bank address signals R_BADDs, and one or more row address signals RADDs. The one or more row command signals R_CMDs may control the memory device to perform a preset row operation. The one or more row bank address signals R_BADDs may select a memory bank, which is to perform a row operation, among the memory banks. The one or more row address signals RADDs may select a row, which is to perform a row operation, included in the selected memory bank.

The row control signal input unit 210 may include a plurality of row input pads R_PAD to receive the row control signals R_CONs. The number of row input pads R_PAD may be smaller than the number of row control signals R_CONs. The row control signal input unit 210 may sequentially receive the row control signals R_CONs through the row input pads R_PAD in synchronization with rising and falling edges of a clock CLK. Since the number of row input pads R_PAD is smaller than the number of row control signals R_CONs to be received, the row control signals R_CONs may not all be received simultaneously. Thus, some of the row control signals R_CONs may be lined in series and inputted, and the row control signal input unit 210 may receive the row control signals R_CONs in synchronization with the respective edges of the clock CLK.

The row control signal input unit 210 may receive the row control signals R_CONs during N clock cycles, where N is an integer greater than or equal to a value obtained by dividing the number of row control signals R_CONs by double the number of row input pads R_PAD. This is because, when one signal is received in synchronization with a rising edge of the clock CLK and one signal is received in synchronization with a falling edge of the clock CLK, two signals may be received through one pad during one clock cycle. For example, when four pads are used to receive five signals, four signals may be received at a first rising edge of the clock, and one signal may be received at a first falling edge of the clock. Thus, the signals may be received for one clock, because N is calculated as an integer greater than or equal to 5/(2*4). When four pads are used to receive 16 signals, four signals may be received at a first rising edge, a first falling edge a second rising edge and a second falling edge of the dock respectively. Thus, the signals may be received for two clock cycles, because N is calculated as an integer greater than or equal to 16/(2*4).

For reference, a row operation and a corresponding row command may include an active operation of activating a word line and an active command corresponding to the active operation, a precharge operation of precharging an activated word line and a precharge command corresponding to the precharge operation, a refresh operation of refreshing data of memory cells coupled to a word line and a refresh command corresponding to the refresh operation, an operation of entering or exiting from a self refresh mode and a self refresh entry/exit command corresponding to the operation, and an operation of entering or exiting from a power down mode for reducing unnecessary power consumption in a standby state and a power down mode entry/exit command corresponding to the operation.

The column control signal input unit 220 may receive a plurality of column control signal C_CONs. The column control signals C_CONs may include one or more column command signals C_CMDs, one or more column bank address signals C_BADDs, and one or more column address signals CADDs. The one or more column command signals C_CMDs may control the memory device to perform a preset column operation. The one or more column bank address signals C_BADDs may select a memory bank, which is to perform a column operation, among the memory banks BANK0 to BANK15. The one or more column address signals CADDs may select a column, which is to perform a column operation, included in the selected memory bank.

The column control signal input unit 220 may include a plurality of column input pads C_PAD to receive the column control signals C_CONs. The number of column input pads C_PAD may be smaller than the number of column control signals C_CONs. The column control signal input unit 220 may sequentially receive the column control signals C_CONs through the column input pads C_PAD in synchronization with rising and falling edges of the clock CLK. Since the number of column input pads C_PAD is smaller than the number of column control signals C_CONs to be received, the column control signals C_CONs may not be received simultaneously. Thus, some of the column control signals C_CONs may be inputted in series, and the column control signal input unit 220 may receive the column control signals C_CONs in synchronization with the respective edges of the clock CLK.

The column control signal input unit 220 may receive the column control signals C_CONs for N clock cycles, where N is an integer greater than or equal to a value obtained by dividing the number of column control signals C_CONs by double the number of column input pads C_PAD. This is because, when one signal is received in synchronization with a rising edge of the dock CLK and one signal is received in synchronization with a falling edge of the clock CLK, two signals may be inputted through one pad for one clock cycle. For example, when four pads are used to receive five signals four signals may be received at a first rising edge of the clock, and one signal may be received at a first falling edge of the clock. Thus, the signals may be received for one clock cycle because N is calculated as an integer greater than or equal to 5/(2*4). When four pads are used to receive 16 signals, four signals may be received at a first rising edge, a first falling edge, a second rising edge, and a second falling edge of the clock. Thus, the signals may be received in two clock cycles, because N is calculated as an integer greater than or equal to 16/(2*4).

For reference, a column operation and a corresponding column command may include a write operation of writing data to a memory cell coupled to an activated word line and a write command corresponding to the column operation, a read operation of reading data from a memory cell coupled to an activated word line and a read command corresponding to the read operation, a write with auto precharge operation of writing data to a memory cell coupled to an activated word line and precharging the activated word line and a write with auto precharge command corresponding to the write with auto precharge operation, and a read with auto precharge operation of reading data from a memory cell coupled to an activated word line and precharging the activated word line and a read with auto precharge command corresponding to the read with auto precharge operation.

The memory device may include an input signal generation unit 250 to generate a plurality of rising input signals RIN1 to RINK, which are sequentially enabled in synchronization with rising edges of the clock CLK and a plurality of falling input signals FIN1 to FINK, which are sequentially enabled in synchronization with falling edges of the clock CLK, where K is an arbitrary natural number. As described above, since the control signal input units 210 and 220 receive two or more signals through input pads R_PAD and C_PAD, respectively, it may be required to determine which signals are inputted through the input pads R_PAD and C_PAD. For example, when the row command signals R_CMDs and the row address signals RADDs are inputted through the row input pads R_PAD, it is to be determined whether the inputted signal is a row command signal R_CMDs or a row address signal RADDs, to perform a row operation using control signals inputted from the memory device.

As each of the control signals is set to be inputted in synchronization with a specific edge of the clock CLK, it may be possible to determine which control signal is inputted, using the rising input signals RIN1 to RINK and the falling input signals FIN1 to FINK. For example, suppose that the memory device receives six control signals through two pads, the row command signal R_CMDs, the row bank address signal R_BADDs and the row address signal RADDs are inputted through a first row input pad R_PAD, and the row command signal R_CMDs, the row bank address signal R_BADDs, and the row address signal RADDs are inputted through a second row input pad R_PAD. Furthermore, suppose that the above-described signals are sequentially inputted in synchronization with a first rising edge, a first falling edge, and a second rising edge of the clock CLK. In this case, among the controls inputted to the respective row input pads R_PAD, the control signal synchronized with the first rising input signal RIN1 may be the row command signal R_CMDs, the control signal synchronized with the second falling input signal FIN1 may be the row bank address signal R_BADDs, and the control signal synchronized with the second rising input signal RIN2 may be the row address signal R_ADDS.

For reference, RIN1 to RINK may represent input signals synchronized with first to K-th rising edges of the clock CLK, and FIN1 to FINK may represent input signals synchronized with first to K-th falling edges of the clock CLK.

The row control unit 230 may select a memory bank and a row in response to the row control signals R_CONs, and control a row operation for the selected row. For this operation, the row control unit 230 may include a row command generation section 231, a first bank selection section 232, and a row address output section 233.

The row command generation section 231 may generate internal row commands IR_CMDs in response to one or more input signals among the rising input signal RIN1 to RINK and the falling input signals FIN1 to FINK, and the one or more row commands R_CMDs. When the one or more row command signals R_CMDs are set to be inputted in synchronization with a specific edge of the clock CLK through a specific row input pad R_PAD, the row command generation section 231 may decode the row control signals R_CONs inputted at the specific edge of the clock CLK through the specific row input pad R_PAD among the row control signals R_CONs, and generate the internal row commands IR_CMDs.

The internal row commands IR_CMDs may include an active command, a precharge command, a refresh command, a self refresh entry command, a self refresh exit command, a power down mode entry command, and a power down mode exit command. The row command generation section 231 may decode the row command signals R_CMDs, and enable an internal row command IR_CMD indicated by a combination of the row command signals R_CMDs among the above-described internal row commands IR_CMDs.

The first bank, selection section 231 may select a memory bank in response to one or more input signals, among the rising input signals RIN1 to RINK and the falling input signals FIN1 to FINK, and one or more row bank address signals R_BADDs. When the one or more bank address signals R_BADDs are set to be inputted in synchronization with a specific edge of the clock CLK through a specific row input pad R_PAD the first bank selection section 232 may select a memory bank by decoding the row control signal R_CONs inputted at the specific edge of the clock CLK through the specific row input pad R_PAD among the row control signals R_CONs, and enable a bank row command corresponding to the selected memory bank, among a plurality of bank row command signals BR_CMD0 to BR_CMD15.

The row address output section 233 may output the one or more row address signals RADDs in response to one or more input signals, among the rising input signals RIN1 to RINK and the falling input signals FIN1 to FINK, and the row control signals R_CONs. When the one or more row address signals RADDs are set to be inputted in synchronization with a specific edge of the clock CLK through the specific row input pad R_PAD, the row address output section 233 may latch only row control signals R_CONs inputted at the specific edge of the clock CLK through the specific row input pad R_PAD, among the row control signals R_CONS, and output the latched signals as the row address signals RADDs.

The column control unit 240 may select a memory bank and column in response to the column control signals C_CONs, and control a column operation for the selected column. For this operation, the column control unit 240 may include a column command generation section 241, a second bank selection section 242, and a column address output section 243.

The column command generation section 241 may generate internal column commands IC_CMDs in response to one or more input signals among the rising input signals RIN1 to RINK and the falling input signals FIN1 to FINK, and the one or more column command signals C_CMDs. When the one or more column command signals C_CMDs are set to be inputted in synchronization with a specific edge of the clock CLK through a specific column input pad C_PAD, the column command generation section 241 may decode column control signals C_CONs inputted at the specific edge of the clock CLK through the specific column input pad C_PAD, among the control signals C_CONs, and generate the internal column commands IC_CMDs.

The internal column commands IC_CMDs may include a read command, a read with auto precharge command, a write command, and a write with auto precharge command. The column command generation section 241 may decode the column command signals C_CMDs and enable an internal row command IR_CMD indicated by a combination of the internal column commands IC_CMDs among the column command signals C_CMDs.

The second bank selection section 242 may select a memory bank in response to one or more input signals, among the rising input signals RIN1 to RINK and the falling input signals FIN1 to FINK, and one or more column bank addresses C_BADDs. When the one or more column bank address signals C_BADDs are set to be inputted in synchronization with a specific edge of the clock CLK through a specific column input pad C_PAD, the second bank selection section 242 may select a memory bank by decoding column control signals C_CONs inputted at the specific edge of the clock CLK through the specific column input pad C_PAD, among the column control signals C_CONs, and enable a bank column command corresponding to the selected memory bank, among the bank column command signals BC_CMD0 to BC_CMD15.

The column address output section 243 may output one or more column address signals CADDs in response to one or more input signals, among the rising input signals RIN1 to RINK and the falling input signals FIN1 to FINK, and the column control signals C_CONs. When the one or more column address signals CADDs are set to be inputted in synchronization with a specific edge of the clock CLK through a specific column input pad C_PAD, the column address output section 243 may latch only column control signals C_CONs inputted at the specific edge of the clock CLK through the specific column input pad C_PAD, among the column control signals C_CONs, and output the latched signals as the column address signals ADDs.

The memory banks BANK0 to BANK15 of the cell array CELL_ARRAY may perform a row operation in response to the respective bank row commands BR_CMD0 to BR_CMD15 and the one or more row address signals RADDs, or perform a column operation in response to the respective bank column commands BC_CMD0 to BC_CMD15 and the one or more column address signals CADDs.

Since the memory device includes a row control signal input unit 210 and a column control signal input unit 220, which are provided separately from each other, the memory device may receive a plurality of row control signals R_CONs for one bank group of the bank groups BG0 and BG1 and one or more column control signals C_CONs for another bank group, simultaneously, and control memory banks included in the different bank groups to independently perform a row operation or a column operation, thereby accomplishing a high-speed operation. Furthermore, since the number of input pads R_PAD and C_PAD for receiving the control signals R_CONs and C_CONs may be reduced, the size of the memory device may be reduced, resulting in greater integration.

FIGS. 4A and 4B are truth tables of the control signals R_CONs and C_CONs for the memory device in accordance with the embodiment of the present invention. FIGS. 4A and 4B illustrate a case where the memory device includes six row input pads R_PAD (hereafter, represented by R<0:5>) and eight column input pads C_PAD (hereafter, represented by C<0:7>), the number of row command signals R_CMDs is three, the number of row bank address signals R_BADDs (hereafter, represented by RBA<0:3>) is four, the number of row address signals RADDs (hereafter, represented by RA<0:15>) is 16, the number of column command signals C_CMDs is four, the number of column bank address signals C_BADDs (hereafter, represented by CBA<0:3>) is four, and the number of column address signals CADDs (hereafter, represented by CA<0:6>) is seven.

FIG. 4A is a truth table of the row control signals R_CONs received by the memory device. Referring to FIG. 4A, the row commands received by the memory device may include a no-operation command RNOP, an active command ACT, a precharge command PRE, a precharge all command PREA, a single bank refresh command REFS, a refresh command REF, a self refresh entry command SRE, a power down mode entry command PDE, a power down mode exit command PAX, and a self refresh exit command SRX. Hereafter, which row control signals R_CONs are inputted at each edge of the clock CLK according to a row command will be described. For reference, a clock enable signal CKE is a signal indicating whether to enable a clock signal inputted from an external source. In the clock enable signal CKE, 'N−1' indicates a state before a corresponding row command is inputted, and indicates a state when the corresponding row command is inputted. When a logic value of an input signal may have any value of 'H' (i.e., high) and 'L' (i.e., low), the logic value may be represented by 'V'. Furthermore, 'PAR' may represent a signal used during parity error check.

The memory device may receive command signals R_CMDs through row input pads R<0> to R<2> (receive a row address signal RA<15> when the active command ACT is received), and receive row bank address signals RBA<0:2> through row input pads R<3> to R<5>, at a first rising edge RE1 of the clock CLK. Then, the memory device may receive row address signals RA<11:12> through the row input pads R<0> and R<1>, receive a parity signal PAR through the row input pad R<2>, receive row address signals RA<13:14> through the row input pads R<3> and R<4>, and receive a row bank address signal RBA<3> through the row input pad R<5>, at a first falling edge FE1 of the clock CLK. Then, the memory device may receive row address signals RA<5:10> through the row input pads R<0> to R<5> at a second rising edge RE2 of the clock CLK. Then, the memory device may receive row address signals RA<0:1> through the row input pads R<0> and R<1>, receive a parity signal PAR through the row input pad R<2>, and receive row address signals RA<2:4> through the row input pads R<3> to R<5>, at a second falling edge FE2 of the clock CLK.

The no-operation command RNOP is a row command indicating that a row operation is not performed, the clock enable signal CLE maintains an H state, row command signal R_CMDs having values of H, H, and H, respectively, may be inputted through the row input pads R<0> to R<2> at the first rising edge of the clock CLK, and a parity signal PAR may be inputted at the first falling edge FE1 of the clock CLK. Similarly, when commands ACT, PRE, PREA, REFS, REF, PDE, SRE, PAX, and SRX are inputted to the memory device, row control signals R_CONs may be inputted through the row input pads R<0:6> at the edges RE1, FE1, RE2, and FE2 of the clock CLK, as illustrated in the truth table of FIG. 4A. For reference, the precharge all command PREA may include a command for precharging all memory banks.

FIG. 4B illustrates a truth table of column control signals C_CONs received by the memory device. Referring to FIG. 4B, the column commands received by the memory device may include a no-operation command CNOP, a read command RD, a read with auto precharge command RDA, a write command WR, and a write with auto precharge command WRA. Hereafter, which column control signals R_CMDs are inputted at each edge of the clock CLK according to a column command will be described. In the clock enable signal CKE, N−1 may represent a state before a corresponding column command is inputted, and 'N' may represent a state when the corresponding column command is inputted. When a logic value of an input signal may have any value of 'H' and 'L', the logic value may be represented by 'V'. Furthermore, 'PAR' may represent a signal used during a parity error check.

The memory device may receive column command signals C_CMDs through column input pads C<0> to C<3> of the clock. CLK, and receive column bank address signals CBA<0:3> through column input pads C<4> to <7>, at a first rising edge RE1. Then, the memory device may receive column address signals CA<0:1> through the column input pads C<0> and C<1>, receive a parity signal PAR through the column input pad C<2>, and receive column address signals CA<2:6> through the column input pads C<3> to C<6>, at a first falling edge FE1 of the clock. CLK.

The no-operation command RNOP is a column command indicating that a row operation is not performed, the clock enable signal CLE maintains an H state, row command signal R_CMDs having values of H, H, and H may be inputted through the column input pads C<0> to C<2> at the first rising edge of the clock CLK, and a parity signal PAR may be inputted at a first falling edge FE1 of the clock CLK. Similarly, when commands RD, RDA, WR, and VARA are inputted to the memory device, column control signals C_CONs may be inputted through the column input pads C<0:6> at the edges RE1 and FE1 of the clock CLK, as illustrated in the truth table of FIG. 4B.

According to the truth tables of FIGS. 4A and 4B, only when the active command ACT is received, the control signals R_CONs and C_CONs may be received for two clock cycles in the example illustrated in FIG. 3. In other cases, however, the control signals R_CONs and C_CONs may be received for one clock. Furthermore, when the active command ACT is received, the row command signals R_CMDs may be received through the row command pads R<0> and R<1> at the first rising edge RE1 of the clock, and the row address signals RA<5> and RA<6> may be received through the row command pads R<0> and R<1> at the second rising edge RE2. When the values of the row address signals RA<5> and RA<6> are 'L' and 'H', which are logic values of the row command signals R_CMDs corresponding to the active command ACT, the active command ACT may be enabled by mistake. Thus, the row command generation section 231 may enable a first block signal BLOCK1 in response to the internal row command IR_CMD, and disable the internal row command IR_CMD when the first block signal BLOCK1 is enabled. Furthermore, when the column control signals C_CONs are received for two clock cycles or more, the column control section 240 may prevent the internal column command IC_CMD from being enabled two or more times, while receiving one command using a second block signal BLOCK2.

FIG. 5 is a waveform diagram for describing an operation where the memory device in accordance with the embodiment of the present invention receives the active command ACT.

Referring to FIG. 5, when the active command ACT is received, the memory device may receive the clock control signals C_CONs for two clock cycles. First, at the first rising edge RE1 of the clock CLK, row commands R_CMDs having values of L and H may be inputted through the row input pads R<0> and R<1>, the row address signal RA<15> may be inputted through the row input pad R<2>, and the row bank address signals RBA<0:2> may be inputted through the row input pads R<3> to R<5>. Then, at the first falling edge FE1 of the clock CLK, the row address signals RA<11:12> may be inputted through the row input pads R<0> and R<1>, a parity signal PAR may be inputted through the row input pad R<2>, row address signals RA<13:14> may be inputted through the row input pads R<3> and R<4>, and the row bank address signal RBA<3> may be inputted through the row input pad R<5>. Then, at the second rising edge RE1 of the clock CLK, the row address signals RA<5:10> may be inputted through the row input pads R<0> to R<5>. Further, at the second falling edge FE2 of the clock CLK, the row address signals RA<0:1> may be inputted through the row input pads R<0> and R<1>, a parity signal PAR may be inputted through the row input pad R<2>, and the row address signals RA<2:4> may be inputted through the row input pads R<3> to R<5>.

Figure 6:
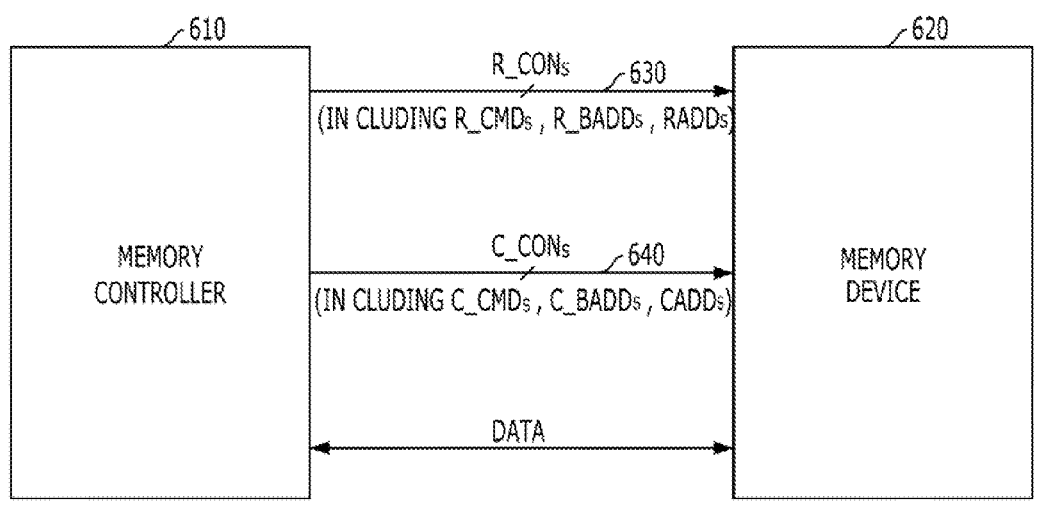
FIG. 6 is a block diagram illustrating a memory system in accordance with an embodiment of the present invention.

FIG. 6 is a block diagram illustrating a memory system in accordance with an embodiment of the present invention.

Referring to FIG. 6, the memory system may include a memory device 610, a memory controller 620, a row channel 630, and a column channel 640.

The memory controller 620 may control a row operation of the memory device 610 by inputting a plurality of row control signals R_CONs to the memory device 610 through the row channel 630, control a column operation of the memory device 610 by inputting a plurality of column control signals C_CONs through the column channel 640, and exchange data DATA with the memory device 610 during a read or write operation while the column operation is performed.

The row control signals R_CONs may include one or more row command signals R_CMDs, one or more row bank address signals R_BADDs, and one or more row address signals RADDs. The row command signals R_CMDs may control the memory device 610 to perform a preset row operation. The one or more row bank address signals R_BADDs may select a memory bank, which is to perform a row operation, among the memory banks BANK0 to BANK15. The one or more row address signals RADDs may select a row, which is to perform a row operation, included in the selected memory bank.

The column control signals C_CONs may include one or more column command signals C_CMDs, one or more column bank address signals C_BADDs, and one or more column address signals CADDs. The column command signals C_CMDs may control the memory device 610 to perform a preset column operation. The one or more column bank address signals C_BADDs may select a memory bank, which is to perform a column operation, among the memory banks BANK0 to BANK15. The one or more column address signals CADDs may select a column, which is to perform a column operation, included in the selected memory bank.

The memory device 610 may include the memory device described with reference to FIG. 2. As described with reference to FIGS. 2 to 5, the memory device 610 may receive a plurality of control signals R_CONs and C_CONS through a smaller number of input pads R_PAD and C_PAD than the number of control signals R_CONs and C_CONs. The memory device 610 may divide the received control signals R_CONs and C_CONs into command signals R_CMDs and C_CMDs, bank address signals R_BADDs and C_BADDs and address signals RADDs and CADDs, using the input pads having received the control signals and edges of the clock CLK synchronized with the control signals select a memory bank and a row/column using the command signals R_CMDs and C_CMDs, the bank address signals R_BADDs and C_BADDs, and the address signals RADDs and CADDs, and perform a row/column operation on the selected row/column.

Since the memory device 610 may receive the row control signals R_CONs and the column control signals C_CONs through different channels, the memory device 610 may receive the row control signals R_CONs and the column control signals C_CONs simultaneously, and control row/column operations of different bank groups simultaneously. Thus, the memory device 610 may accomplish high-speed operations. Furthermore, since the memory device 610 may receive the control signals R_CONs and C_CONs in series, it may be possible to reduce the number of lines included in the channels 630 and 640, through which the control signals are received, and the number of input pads R_PAD and C_PAD. Thus, the size of the memory system may be reduced to achieve high integration.

In accordance with the embodiments of the present invention, since the channel for receiving row control signals and the channel for receiving column control signals are separately provided, controls signals of different bank groups may be received simultaneously. Thus, the time required for receiving the control signals may be reduced. Furthermore, since two or more bank groups may be operated simultaneously, the memory device and the memory system may be operated at high speed.

Furthermore, as a plurality of control signals are received in series for one or more clock cycles, the number of input pads required for receiving control signals may be reduced. Thus, the memory device and the memory system may be reduced in size and achieve higher integration.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
a plurality of memory banks;
a row control signal input unit suitable for receiving a plurality of row control signals, wherein the row control signals include one or more row control signals and one or more first address signals;
a column control signal input unit suitable for receiving a plurality of column control signals, wherein the column control signals include one or more column control signals and one or more second address signals;
a row control unit suitable for selecting a first memory bank among the plurality of memory banks and a row in response to the row control signals, and controlling a row operation for the selected row; and
a column control unit suitable for selecting the first memory bank or another memory bank among the plurality of memory banks and a column in response to the column control signals, and controlling a column operation for the selected column,
wherein the row control signal input unit sequentially receives the row control signals through a plurality of row input pads, and the column control signal input unit sequentially receives the column control signals through a plurality of column input pads, and
wherein one or more row input pads among the plurality of row input pads receives the row control signals and the first address signals, and one or more column input pads among the plurality of column input pads receives the column control signals and the second address signals.

2. The memory device of claim 1, wherein the number of the row input pads is less than the number of the row control signals, and the number of the column input pads is less than the number of the column control signals.

3. The memory device of claim 1, wherein the first address signals comprise one or more row bank address signals, and one or more row address signals, and
the second address signals comprise one or more column bank address signals, and one or more column addresses.

4. The memory device of claim 2, wherein the row operation comprises an active operation, a precharge operation, a refresh operation, and a power down operation, and
the column operation comprises a read operation, a write operation, and a mode register setting operation.

5. The memory device of claim 1, wherein the plurality of memory banks forms a plurality of bank groups each comprising one or more memory banks, and
the row control signals for one bank group among the bank groups and the column control signals for another bank group are inputted simultaneously.

6. A memory system comprising:
a memory device including a plurality of memory banks, suitable for sequentially receiving a plurality of row control signals through a plurality of row input pads, selecting a first memory bank among the plurality of memory banks and a row, and performing a row operation for the selected row, and suitable for sequentially receiving a plurality of column control signals through a plurality of column input pads, selecting the first memory bank or another memory bank among the plurality of memory banks and a column, and performing a column operation for the selected column; and
a memory controller suitable for transmitting the row control signals and the column control signals to the memory device, to control the memory device
wherein the row control signals include one or more row command signals and one or more first address signals, the column control signals include one or more column command signals and one or more second address signals, and
wherein one or more row input pads among the plurality of row input pads receives the row command signals and the first address signals, and one or more column input pads among the plurality of column input pads receives the column command signals and the second address signals.

7. The memory system of claim 6, wherein the number of the row input pads is less than the number of the row control signals, and
the number of the column input pads is less than the number of the column control signals.

8. The memory system of claim 7, further comprising:
a row channel coupled between the memory device and the memory controller, and suitable for transmitting the row control signals; and
a column channel coupled between the memory device and the memory controller, and suitable for transmitting the column control signals.

9. The memory system of claim 7, wherein the first address signals comprise one or more row bank address signals and one or more row address signals, and
the second address signals comprise one or more column bank address signals and one or more column address signals.

10. The memory system of claim 7, wherein the row operation comprises an active operation, a precharge operation, a refresh operation, and a power down operation, and
the column operation comprises a read operation, a write operation, and a mode register setting operation.

11. The memory system of claim 7, wherein the plurality of memory banks forms a plurality of bank groups each comprising one or more memory banks, and
the memory controller transmits the row control signals for one bank group among the bank groups and the column control signals for another bank group to the memory device.

* * * * *